United States Patent
Tao et al.

(10) Patent No.: US 12,451,429 B2
(45) Date of Patent: Oct. 21, 2025

(54) INTERCONNECTION STRUCTURE FOR A SEMICONDUCTOR DEVICE

(71) Applicant: IMEC VZW, Leuven (BE)

(72) Inventors: Zheng Tao, Heverlee (BE); Stefan Decoster, Bertem (BE)

(73) Assignee: IMEC VZW, Leuven (BE)

( * ) Notice: Subject to any disclaimer, the term of this patent is extended or adjusted under 35 U.S.C. 154(b) by 486 days.

(21) Appl. No.: 18/053,636

(22) Filed: Nov. 8, 2022

(65) Prior Publication Data

US 2023/0170300 A1    Jun. 1, 2023

(30) Foreign Application Priority Data

Nov. 29, 2021 (EP) .................................... 21210946

(51) Int. Cl.
  *H01L 23/528* (2006.01)
  *H01L 21/3213* (2006.01)
  *H01L 21/768* (2006.01)

(52) U.S. Cl.
  CPC ...... *H01L 23/528* (2013.01); *H01L 21/32139* (2013.01); *H01L 21/76802* (2013.01); *H01L 21/76877* (2013.01); *H01L 21/76885* (2013.01)

(58) Field of Classification Search
  CPC ............. H01L 23/528; H01L 21/32139; H01L 21/76802; H01L 21/76877; H01L 21/76885; H01L 21/76834; H01L 21/76883; H01L 21/76897; H01L 21/76816; H01L 21/76895; H01L 23/5386
  See application file for complete search history.

(56) References Cited

U.S. PATENT DOCUMENTS

| | | | |
|---|---|---|---|
| 2016/0049364 A1* | 2/2016 | Edelstein | H01L 21/76834 257/774 |
| 2017/0271202 A1* | 9/2017 | Xu | H01L 23/49894 |
| 2020/0357748 A1 | 11/2020 | Dutta et al. | |
| 2021/0082714 A1 | 3/2021 | Xie et al. | |
| 2021/0118732 A1 | 4/2021 | Chen et al. | |
| 2023/0134820 A1* | 5/2023 | Motoyama | H01L 21/76837 257/751 |

FOREIGN PATENT DOCUMENTS

WO    2017171715 A1    10/2017

OTHER PUBLICATIONS

Extended European Search Report issued in European Patent Application No. 21210946.6 dated May 9, 2022.

* cited by examiner

*Primary Examiner* — Karen Kusumakar
(74) *Attorney, Agent, or Firm* — MCDONNELL BOEHNEN HULBERT & BERGHOFF LLP

(57) ABSTRACT

A method for forming an interconnection structure for a semiconductor device and an interconnection structure is disclosed. The method includes forming a conductive layer on an insulating layer and etching the conductive layer to form a first conductive line. Thereafter, a spacer is formed on a side wall of a first end portion of the first conductive line. The method further includes forming a second conductive line, parallel to the first conductive line, having a second end portion, wherein a side wall of the second end portion is arranged to abut the spacer such that the first and the second metal line are extending along the same line and separated by the spacer. A recess is formed in the second metal line, extending along a portion of the second metal line, and a second mask layer is arranged in the recess.

18 Claims, 5 Drawing Sheets

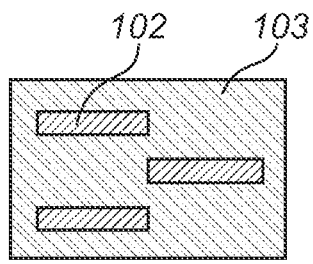
Fig. 2A
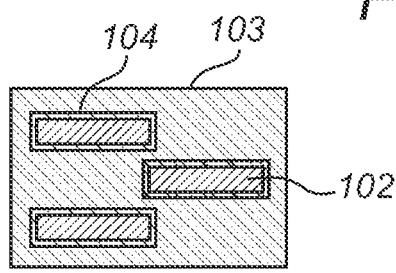
Fig. 2B
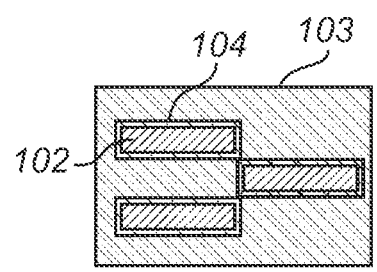
Fig. 2B´
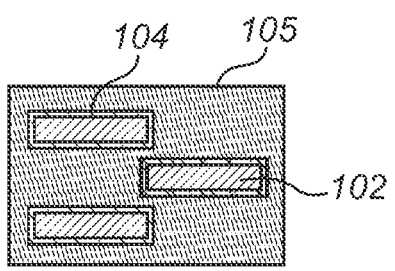
Fig. 2C
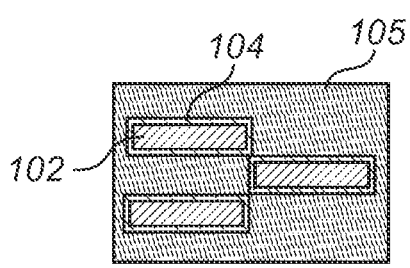
Fig. 2C´
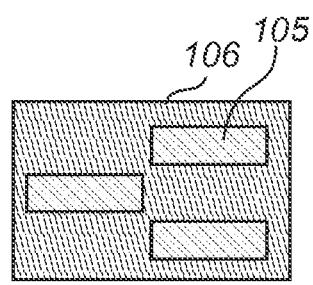
Fig. 2D
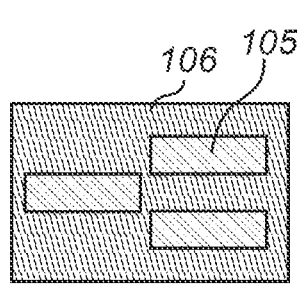
Fig. 2D´
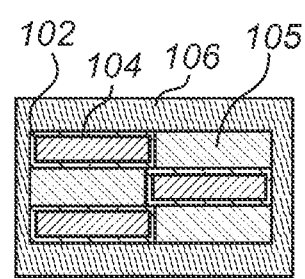
Fig. 2D´´

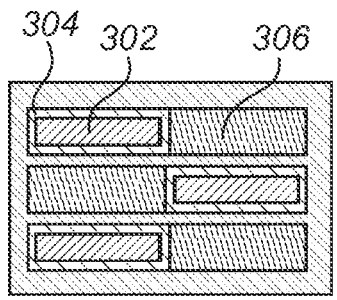
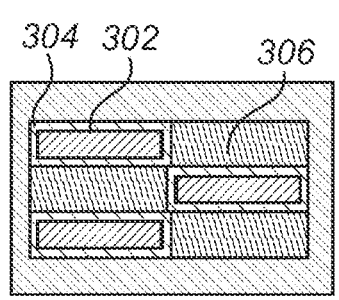
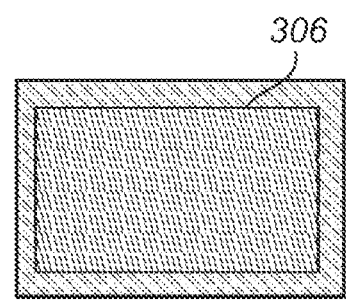
Fig. 4A                Fig. 4A´               Fig. 4A´´
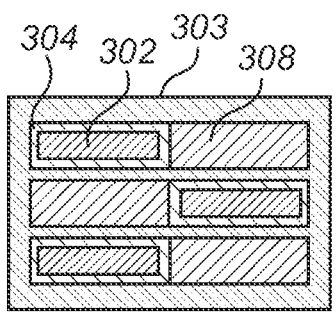
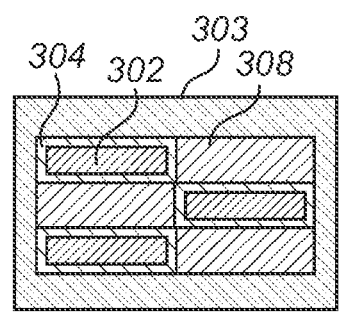
Fig. 4B                Fig. 4B´
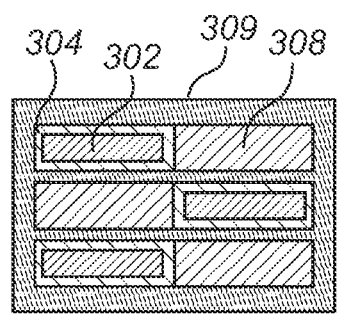
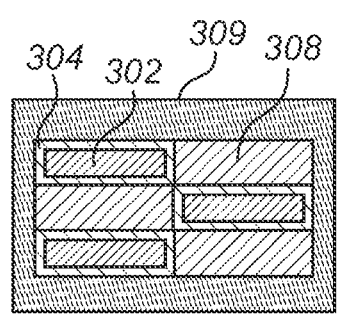
Fig. 4C                Fig. 4C´

INTERCONNECTION STRUCTURE FOR A SEMICONDUCTOR DEVICE

CROSS-REFERENCE

This application claims priority from European patent application no. 21210946.6, filed on Nov. 29, 2021, which is incorporated by reference in its entirety.

TECHNICAL FIELD OF THE PRESENT DISCLOSURE

The present disclosure relates to a method for forming an interconnection structure, and to an interconnection structure.

BACKGROUND OF THE PRESENT DISCLOSURE

Modern circuit fabrication typically includes processes of forming electrical interconnection structures for interconnecting semiconductor devices in a functioning circuit. An interconnection structure may include one or more interconnection levels or tiers, which are formed above the active device region. An interconnection level includes horizontal conductive paths or lines arranged in an insulating material layer. Conductive paths of different interconnection levels may be interconnected by conductive vias extending vertically through the insulating layers.

In conventional circuit fabrication, an interconnection level is typically formed in what in the art is known as a "dual damascene process". According to this approach, horizontally extending trenches are etched in the insulating layer. Further, vertically extending via holes are formed in the insulating layer. Thereafter the trenches and via holes are simultaneously filled with a conductive material to form conductive lines in the trenches and conductive vias in the via holes. The process may be repeated to form a stack of interconnection levels.

In modern circuit fabrication, multiple patterning techniques such as self-aligned double patterning (SADP) or quadruple patterning (SAQP), are typically employed during trench formation to enable conductive line patterns with sub-lithographic critical dimensions. Forming of an interconnection level typically involves forming a plurality of "cut" conductive lines, i.e. interrupted or discontinuous line segments separated by a gap. "Line cuts" are typically made by trench blocking techniques wherein discontinuous trenches with two or more separate trench sections may be formed in the dielectric layer. The separate trench sections may then be filled with the conductive material in accordance with the dual damascene process.

However, when using state-of-the-art patterning and etching techniques, it is becoming increasingly difficult to meet the demand for the ever more aggressive line pitches.

SUMMARY OF THE PRESENT DISCLOSURE

An objective of the present disclosure is thus to provide a method for allowing forming of interconnection structures comprising tight-pitch, tip to tip conductive lines. Further and alternative objectives may be understood from the following.

According to an aspect of the present disclosure, there is provided a method for forming an interconnection structure for a semiconductor device, the method comprising:

forming a conductive layer on an insulating layer;

etching the conductive layer to form a first conductive line, using a first mask layer as an etch mask;

forming a spacer on a side wall of a first end portion of the first conductive line;

forming a second conductive line, parallel to the first conductive line, having a second end portion, wherein a side wall of the second end portion is arranged to abut the spacer, such that the first and the second metal line are extending along the same line and separated by the spacer;

forming a recess in the second metal line, the recess extending along a portion of the second metal line; and forming a second mask layer in the recess.

According to another aspect of the present disclosure there is provided an interconnection structure for a semiconductor device, comprising a first conductive line and a second conductive line arranged on an insulating layer. The interconnection structure further comprises a spacer separating the first and second conductive lines, wherein a side wall of a first end portion of the first conductive line and a side wall of a second end portion of the second conductive line abut the spacer, such that the first and second conductive lines are extending along the same line and separated by the spacer. The interconnection device further comprises a first mask layer covering the first conductive line and a second mask layer arranged in a recess in the second metal line, the recess extending along a portion of the second metal line.

The present disclosure allows for the formation of tight-pitch or tight tip to tip conductive line patterns. In contrast to a conventional damascene-style process, in which the conductive lines are formed by the portions of the conductive material layer deposited in pre-patterned trenches, the presently disclosed process allows for the first conductive line to be formed by etching the deposited conductive layer. Further, the presently disclosed process allows for the conductive lines to be separated by arranging a spacer between the lines. Expressed differently, the present disclosure is based on the realization that providing a spacer separating two conductive lines beneficially allows for a smaller tip to tip distance between conductive lines to be achieved, compared to conventional damascene-style processing (with the tip to tip distance referring to the minimum distance between the end portions of a first and a second conductive line). Thus, by separating the first and second conductive lines by a spacer, tip to tip spacings below 10 nm may be achieved, as the distance between or the separation of the first and second conductive lines can be controlled by the thickness of the spacer. By closely controlling the spacer thickness, a corresponding control of the separation between the end portions of the first and second conductive lines can be achieved. Thus, very low critical dimensions, such as spacer thicknesses below 10 nm, may be obtained relatively easily as compared to, for instance, conventional lithography processes.

The spacer further allows for via connections in subsequent interconnection layers, arranged above the first and second conductive lines, to be self-aligned to the spacer and thus formed at similarly tight pitches. Such via connections in upper interconnection layers may be arranged to contact a contacting portion defined by a second mask layer and the spacer.

The second mask layer may be provided by recessing a part of the second metal line and filling the recess with the second mask layer. Thus, the conductive line may be considered at least partly covered by the second mask layer, allowing the contacting portion of the second conductive line, generally abutting the spacer, to be contacted from above.

As will be discussed in further detail below, the tip to tip arrangement of the first and second conductive lines may be achieved by a direct metal etch of the first conductive line, followed by a spacer deposition and either a damascene-style processing or a direct metal etch of the second conductive line.

The spacer may comprise a dielectric material, such as for instance a layer of a carbon-comprising material or a silicon-comprising material, such as amorphous carbon, polysilicon, amorphous silicon, silicon oxide, silicon nitride, or silicon carbide, which may be deposited for example by CVD or ALD. The deposition may be of an isotropic nature, resulting in a substantially conformal layer having the same thickness in all directions. Alternatively, the deposition may be of a more anisotropic nature, in which the thickness of the resulting layer may vary in the horizontal and the vertical directions.

By the terminology "using a (mask) layer as an etch mask" is hereby meant that one or more underlying layers are etched while said layer counteracts etching of the underlying layer(s) in regions covered by said layer. The underlying layer(s) are hence etched selectively to said layer acting as an etch mask.

By etching of a feature "A" of a first material, selectively to a feature "B" of a second material, is hereby meant exposing the features A and B to an etch process wherein the feature A is etched at a greater rate than the feature B. This may be achieved by selecting the material of feature A and the material of feature B as a combination of materials presenting different etch rates in the etch process. Hence, portions of the feature A exposed to the etching process may be removed while portions of the feature B exposed to the etch process may be preserved. The preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may beneficially be 2:1 or higher, 10:1 or higher, or 40:1 or higher, depending inter alia on the duration of the etching and the relative dimensions of the features A and B.

By "conductive layer" is generally meant a layer formed of an electrically conductive material. Non-limiting examples of suitable conductive materials include, inter alia, Ru, Mo, W, Al, and Co, as well as combinations thereof, and may be possible to etch to form the first set of conductive lines from the first conductive layer. It is further understood that the conductive lines may be comprised of any of the above-mentioned conductive materials, alone or in combination.

By "spacers" or "spacer lines" are generally meant a layer, generally comprising a dielectric material, arranged on sidewalls of a conductive line, such as the first and/or second conductive line. The spacers may define a separating distance, such as a dielectric separation between the first and second set of conductive lines.

By "horizontal" is generally understood a direction parallel to the main plane of extension of the layers and substrate onto which the semiconductor device is formed. Consequently, by "vertical" is generally understood the direction normal to the main surface of the layers and the substrate.

The second conductive line may, in some embodiments, be formed in a damascene-style process. Thus, a trench layer may be deposited above the insulating layer, followed by the forming of a trench etched in the trench layer and filling the trench with a conductive material to form the second conductive line. It is understood that the trench layer may differ from the spacer with regard to etch selectivity, thereby allowing for the trench to be self-aligned to the spacer. After the filling, excess material may be etched back or removed by a planarization or polishing, such as chemical-mechanical polishing (CMP) process.

The second conductive line may, in some embodiments, be formed in a "direct etch" process, wherein a second conductive layer is formed above the insulating layer and etched to form the second conductive line, using a third mask layer as an etch mask. The third mask may thus act as a block mask.

The second conductive layer may be planarized or polished prior to etching the second conductive layer, for instance in a CMP process.

In some embodiments, the method comprises forming a protective layer at a sidewall of a third end portion of the second conductive line, wherein the third end portion is opposite the second end portion. The protective layer may comprise an insulating material, such as a layer of silicon oxide or some other conventional low-K dielectric layer. The protective layer beneficially allows further conductive lines to be arranged relatively close to the second conductive line short-circuiting.

The first and the third mask may differ with respect to etch selectivity. As discussed above, this allows, for instance, the third mask to be etched more heavily as compared to the first mask. This beneficially allows for some features or material parts to be etched away while others remain substantially unetched, without the need for additional masking or protection of such features.

The recess may be laterally spaced apart from the spacer to define a contacting portion abutting the spacer. This allows for upper via connections to be self-aligned between the spacer and the second mask.

In some embodiments, a top surface of the first mask layer and a top surface of the second mask layer are arranged at the same vertical level. This allows for a product having a substantially flat top surface for facilitating subsequent processing steps. The first and the second mask may differ with respect to etch selectivity.

In some embodiments, at least one of the first and second conductive lines is formed of at least one of Ru, Mo, W, Al and Co or alloys thereof. Further, the first and the second conductive lines may consist of different conductive materials, or of substantially the same conductive material.

It is understood that the optional additional features of the method according to the first aspect apply, when applicable, to the structure according to the second aspect as well.

BRIEF DESCRIPTION OF THE DRAWINGS

The above, as well as additional objects, features and benefit of the present disclosure, will be better understood through the following illustrative and non-limiting detailed description, with reference to the appended drawings. In the drawings like reference numerals will be used for like elements unless stated otherwise.

FIG. 1A shows, in cross section, a portion of a representative intermediate structure or device.

FIG. 1B shows a representative intermediate structure with spacer 104 formed on a side wall of a first end portion of the first conductive line 101.

FIG. 1C shows an embodiment in which a trench layer 105 has been deposited on the intermediate structure in FIG. 1B.

FIG. 1D shows a third mask layer 106 has been deposited on an intermediate structure of FIG. 1C. The third mask layer 106 has further been etched to expose a portion of the underlying trench layer 105 accessible over the second conductive line 108.

FIG. 1E shows a trench 107 has been etched in the trench layer 105 using the third mask layer 106 as an etch mask.

FIG. 1F shows a trench filled with a conductive material to form the second conductive line 108.

FIG. 1G shows a recess 109 has been formed in the second metal line 108, wherein the recess 109 extends along a portion of the second metal line 108.

FIG. 1H shows a second mask layer 110 has been formed in the recess 109.

FIGS. 2A-2F' are top views illustrating process flows according to some methods for forming an interconnection structure. Intermediate structures are discussed above with reference to FIGS. 1A-1F.

FIG. 2A corresponds to FIG. 1A and depicts a representative structure comprising an insulating layer 103 and a plurality of first conductive metal lines 101, having a first mask layer 102 arranged thereon.

FIGS. 2B and 2B' correspond to FIG. 1B and depict spacers 104 formed on a side wall of a first end portion of each of the first conductive lines 101.

FIGS. 2C and 2C' correspond to FIG. 1C and depict an embodiment comprising a trench layer 105 deposited on the intermediate structure as depicted in FIGS. 2B and 2B'.

FIGS. 2D, 2D' and 2D" correspond to FIG. 1D and depict an embodiment comprising a third mask layer 106 deposited on an intermediate structure. The third mask layer 106 has further been patterned to expose a portion of the underlying trench layer 105.

FIGS. 2E and 2E' correspond to FIG. 1E and depict trenches 107 have been etched in the trench layer 105 using the third mask layer 106 as an etch mask.

FIGS. 2F and 2F' correspond to FIG. 1F and illustrate a representative embodiment wherein the trenches have been filled with a conductive material to form a plurality of second conductive lines 108.

FIG. 3D shows a protective layer 309 arranged at a sidewall of a third end portion of the second conductive line, wherein the third end portion is opposite to the second end portion. The protective layer 309 may comprise an insulating material.

FIG. 4A-4C' depict top-views of the interconnection structure and intermediate structures corresponding FIGS. 3A-3D.

FIGS. 4A-4C' are top views illustrating process flows according to some methods for forming an interconnection structure and depict top-views of the interconnection structure and intermediate structures corresponding FIGS. 3A-3D.

FIGS. 4A, 4A', 4A" correspond to FIG. 3B and depict a plurality of first conductive lines arranged separate from each other both in a direction orthogonal to the lines and in a lengthwise direction. Here, a second conductive layer has been formed above the insulating layer 303, followed by a third mask layer 306 patterned to protect the portions of the second conductive layer from which the second conductive lines 308 are to be formed.

FIGS. 4B, 4B' correspond to FIG. 3C and show the second conductive layer after it has been etched through the third mask layer 306 to form the second conductive lines 308.

FIGS. 4C, 4C' correspond to FIG. 3D and show a representative interconnection structure after a protective layer 309 has been arranged around the first and second conductive lines 301, 308.

DETAILED DESCRIPTION OF THE PRESENT DISCLOSURE

A method for forming an interconnection structure, suitable for instance for a semiconductor device, will now be described with reference to FIGS. 1A-1H.

Figure 1A:
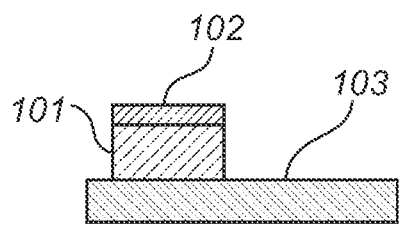
FIGS. 1A-1H are cross sections illustrating process flows according to some methods for forming an interconnection structure.

With reference to FIG. 1A, there is shown, in cross section, a portion of an intermediate structure or device. The structure may extend laterally or horizontally beyond the illustrated portion. The illustrated planes or layers extending through the structure are common to all the figures unless stated otherwise. It is noted that the relative dimensions of the shown elements, in particular the relative thickness of the layers, is merely schematic and may, for the purpose of illustrational clarity, differ from a physical structure.

The structure comprises an insulating layer 103, a first conductive metal line 101 and a first mask layer 102. The insulating layer 103 may be formed of an electrically insulating material, typically a dielectric layer such as a layer of silicon oxide or some other conventional low-K dielectric layer. For instance, the insulating layer 103 may be a layer stack which in addition to a low-K dielectric layer comprises an interface layer and/or an oxide capping layer. The insulating layer 103 may, for instance, be deposited by chemical vapor deposition (CVD).

A first metal line 101 may be formed by providing a conductive layer on the insulating layer 103 and thereafter etching the conductive layer, using the first mask layer 102 as an etch mask. The first metal line 101 may be formed using a sequence of lithography and etching steps (a "litho-etch sequence"), for example including a dry etching process such as a reactive ion etch (RIE) or ion beam etching (IBE).

The conductive layer may be a metal layer, for instance a layer of ruthenium (Ru). Other examples of the conductive layer include a layer of molybdenum (Mo), tungsten (W), aluminum (Al) and cobalt (Co), and alloys thereof. Generally, a metal may be used, which is suitable for patterning by means of metal etching. The conductive layer may be deposited by CVD or atomic layer deposition (ALD). The conductive layer may also be deposited by physical vapor deposition (PVD) or electroplated. The conductive layer may be a single metal of the aforementioned materials, or a multilayer combining two or more metals deposited with the same or different methods among the ones just cited.

The first mask layer 102 may, for example, be a hard mask composed of silicon oxide ($SiO_2$), silicon nitride (SiN), silicon carbon nitride (SiCN or silicon carbide (SiC). It will however be appreciated that other materials could be used as well, such as spin-on oxide, and conductive materials which may be removed in later processing steps. The first mask layer 102 may be used as an etch mask for forming the first set of conductive lines 101 from the conductive layer. The first conductive line 101 may be formed by a metal etch process, also referred to as a direct metal etch.

A litho-etch sequence may generally comprise forming a photoresist mask layer on the layer which will be patterned, i.e., the "target layer" (such as the conductive layer). A pattern (e.g. a pattern of openings, trenches or lines) may be lithographically defined in the photoresist layer and then transferred onto the target layer by etching while using the patterned photoresist layer as an etch mask. The photoresist layer may thereafter be stripped from the target layer. A litho-etch sequence may also comprise forming a lithographic mask layer stack (a "litho stack") on the target layer. The litho stack may comprise a patterning layer as a lower layer of the litho stack. The patterning layer may be an amorphous-carbon film, or some other conventional organic or non-organic patterning film allowing high-fidelity pattern transfer into the target layer in question. The litho stack may further comprise a photoresist layer and a set of transfer layers intermediate between the patterning layer and the photoresist layer. The set of intermediate layers may comprise, for instance, one or more anti-reflective coatings such as SiOC layers, SOG layers and optionally a planarization layer such as an organic spin-on layer (e.g. a SOC layer). A pattern may be lithographically defined in the photoresist layer and subsequently transferred into lower layers of the litho stack, in a number of etch steps, and subsequently into the patterning layer. The pattern transfer process may cause a partial consumption of the litho stack layer stack. For instance, the photoresist layer may be consumed during the transfer process. The litho-etch sequence may conclude by etching the target layer while using the patterned patterning layer as an etch mask. Any remaining layers of the litho stack may thereafter be stripped from the target layer.

Figure 1B:
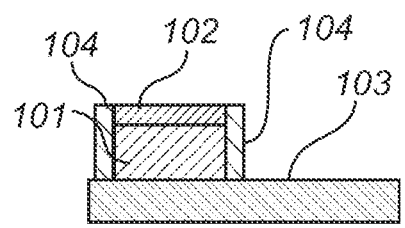

In FIG. 1B, a spacer 104 has been formed on a side wall of a first end portion of the first conductive line 101. The spacer may be formed by depositing a spacer layer followed by a litho-etch sequence to achieve the desired location and thickness of the spacer 104. The spacer may, for example, have a thickness ranging from 4 to 14 nm, such as ranging from 6 to 12 nm, such as ranging from 6 to 10 nm. The spacer 104 may for instance be formed of a layer of a carbon-comprising material or a silicon-comprising material, such as amorphous carbon, polysilicon, amorphous silicon, silicon oxide, silicon nitride, or silicon carbide, which may be deposited for example by CVD or ALD. The deposition may be of an isotropic nature, resulting in a substantially conformal layer having the same thickness on surfaces in all directions. Alternatively, the deposition may be of a more anisotropic nature, in which the thickness of the resulting layer may vary in the horizontal and the vertical directions. In the structure illustrated in FIG. 1B any spacer material on horizontal surfaces has been etched or recessed, leaving the spacers 104 on the sidewalls of the first conductive line. It is thus understood that the spacer may be arranged at a side wall of a first end portion and a side wall of a second end portion of the first conductive line 101. The spacers may, in some embodiments, be arranged further on side walls of the first conductive line to provide electrical insulation to neighbouring structures, such as other conductive lines.

The second conductive line 108 may, in some embodiments, be formed in a damascene-style process, and in other examples by means of a direct metal etch similar to the one discussed above for the first conductive line 101. In the following, an example of a damascene-style process will be discussed.

Figure 1C:
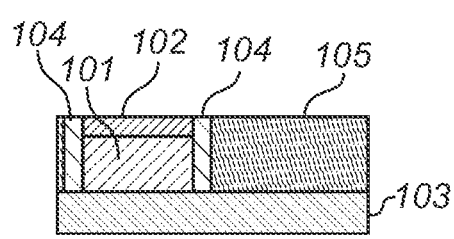

Hence, FIG. 1C depicts an embodiment in which a trench layer 105 has been deposited on the intermediate structure in FIG. 1B. The trench layer 105 may comprise an electrically insulating material, typically a dielectric layer such as a layer of silicon oxide, another suitable oxide, or some other conventional low-K dielectric material. In this particular embodiment, the intermediate structure has been planarized using a CMP process so as to provide a substantially planar surface. It is understood that the intermediate structure may be planarized by etching back the deposited trench layer.

Figure 1D:
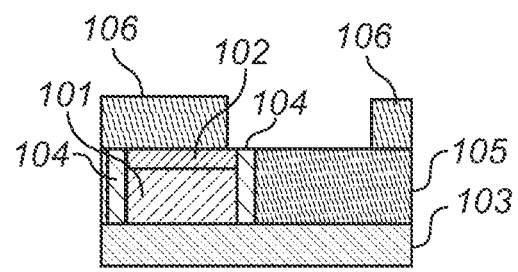

In FIG. 1D, a third mask layer 106 has been deposited on an intermediate structure of FIG. 1C. The third mask layer 106 has further been etched to expose a portion of the underlying trench layer 105 accessible over the second conductive line 108.

Figure 1E:
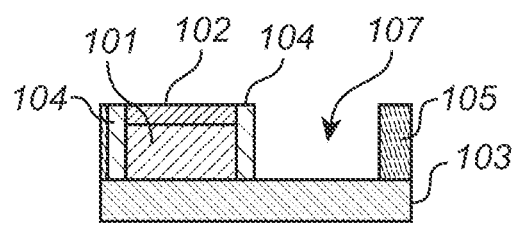

In FIG. 1E, a trench 107 has been etched in the trench layer 105 using the third mask layer 106 as an etch mask. It is understood that the trench layer 105 may differ from the spacer 104 with regard to etch selectivity. This beneficially allows, for instance, the trench layer 105 to be etched while leaving the spacer 104 substantially intact. It will be appreciated that the trench layer 105 further may differ from the first mask layer 102 with respect to etch selectivity, which may be particularly beneficial in case the first mask layer 102 is partly exposed by the third mask layer 106. The trench 107 may thus be etched in a self-aligned fashion to the spacer.

Figure 1F:
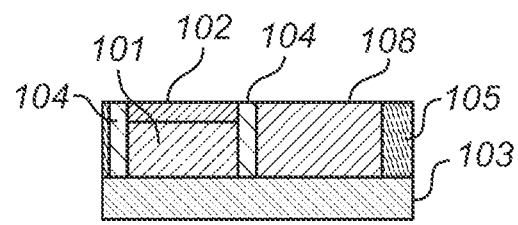

Thereafter, the trench may be filled with a conductive material to form the second conductive line 108 as illustrated in FIG. 1F. After the filling, excess material may be etched back or removed by a chemical-mechanical polishing (CMP) process. Thus, the second conductive line 108 is formed, parallel to the first conductive line 101, having a second end portion, wherein a side wall of the second end portion is arranged to abut the spacer, such that the first and the second metal line 101, 108 are extending along the same line and separated by the spacer 104.

Figure 1G:
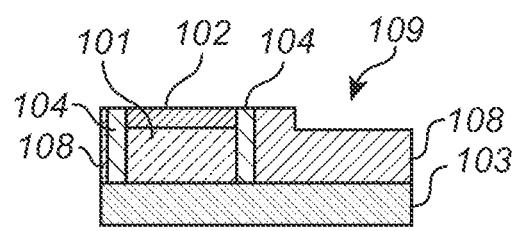
Figure 1H:
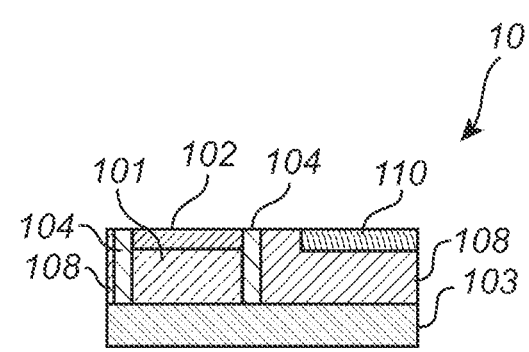

In FIG. 1G, a recess 109 has been formed in the second metal line 108, wherein the recess 109 extends along a portion of the second metal line 108. Further, a second mask layer 110 has been formed in the recess 109, see FIG. 1H. The recess may be laterally spaced apart from the spacer 104. Accordingly, a top portion of the second conductive line 108 may be defined between the spacer 104 and the second mask layer 110. This portion may be referred to as a contacting portion and may be used for connecting the second conductive line to an upper interconnection level, for instance by means of a via connection.

Similar to the first conductive layer, the second conductive layer may comprise Ru, Mo, W, Al, and Co, as well as combinations thereof. Due to the damascene-style processing, it is appreciated that the second conductive layer may not necessarily be limited to materials that are possible to etch.

In some embodiments, a TiN layer or TiN liner may be arranged under the first and/or second conductive lines for improving adhesion between the conductive line and the substrate. The TiN layer may cover the entire interface between the first and/or second conductive lines, or portions of the interface. The thickness of the TiN layer may for instance range from about 0.1 to about 2 nm.

Figure 2E:
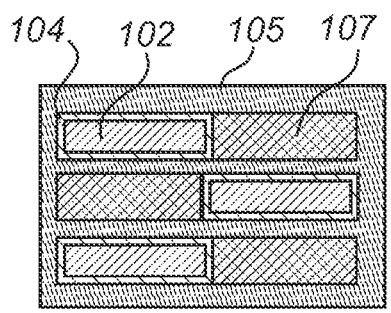
Figure 2E:
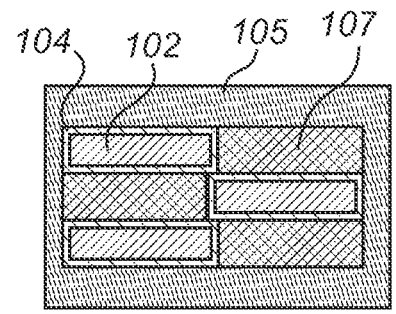

FIGS. 2A-2F' depict top-views of the interconnection device and intermediate structures discussed above with reference to FIGS. 1A-1F. FIG. 2A corresponds to FIG. 1A, FIGS. 2B and 2B' correspond to FIG. 1B, FIGS. 2C and 2C' correspond to FIG. 1C, FIGS. 2D, 2D' and 2D" correspond to FIG. 1D, FIGS. 2E and 2E' correspond to FIG. 1E, and FIGS. 2F and 2F' correspond to FIG. 1F.

Figure 2F:
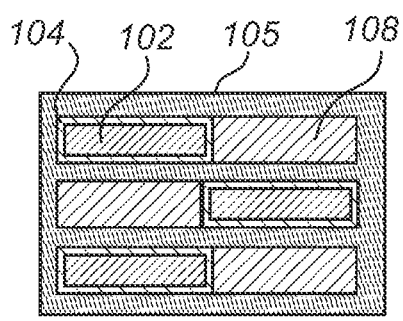
Figure 2F:
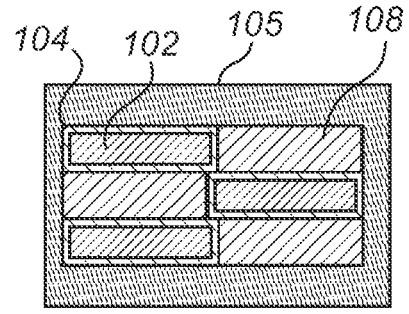

Thus, FIG. 2A depicts a structure comprising an insulating layer 103 and a plurality of first conductive metal lines 101, having a first mask layer 102 arranged thereon. FIGS. 2B and 2B' depict spacers 104 formed on a side wall of a first end portion of each of the first conductive lines 101. FIGS. 2C and 2C' depict an embodiment comprising a trench layer 105 deposited on the intermediate structure as depicted in FIGS. 2B and 2B'. FIGS. 2D, 2D' and 2D" depict an embodiment comprising a third mask layer 106 deposited on an intermediate structure. The third mask layer 106 has further been patterned to expose a portion of the underlying trench layer 105. In FIGS. 2E and 2E' trenches 107 have been etched in the trench layer 105 using the third mask layer 106 as an etch mask. FIGS. 2F and 2F' illustrate examples wherein the trenches have been filled with a conductive material to form a plurality of second conductive lines 108.

In some embodiments, the plurality of first conductive lines 101 are arranged separate from each other both in a direction orthogonal to the lines and in a lengthwise direction, see FIG. 2A. The plurality of conductive lines may be provided with spacers to enclose each of the first conductive lines. Thus, the first conductive lines may be considered having a relaxed pitch. Trenches 107 may be etched in the trench layer 105 using the third mask layer 106 as an etch mask. Here, the third mask may comprise separate mask openings for each of the trenches, see FIG. 2D.

As depicted in FIG. 2B', the plurality of first conductive lines may be arranged with tighter pitch as compared to FIG. 2A. The plurality of conductive lines may be provided with spacers to enclose each of the first conductive lines. In this example, the conductive lines may be arranged sufficiently close to each other to allow each spacer 104 to at least partly abut a neighbouring spacer 104. Expressed differently, each spacer 104 may be considered to be in contact with at least one other spacer 104. This allows for a great relaxation in the lithography print using the third mask layer 106, as illustrated in FIG. 2D", as separate mask openings of the third mask layer 106 are not necessary. Rather, one mask opening of the third mask layer 106 may be provided and used for forming a plurality of trenches 107 defined by the spacing between the neighbouring conductive lines 101. Alternatively, the third mask layer 106 may be patterned with separate mask openings for each of the trenches, as illustrated in see FIG. 2D'.

As an alternative to the above damascene-style processing, the second metal line may be formed in a direct etch process which will be described in the following with reference to FIGS. 3A-3D.

Figure 3A:
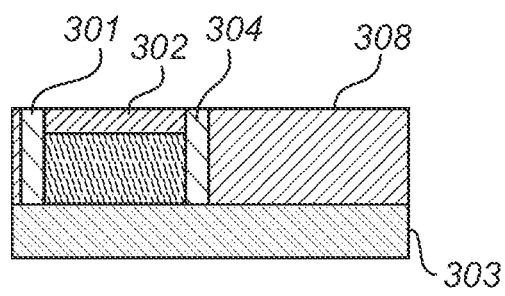
FIGS. 3A-3D are cross sections illustrating process flows according to some methods for forming an interconnection structure and depict embodiments where a second conductive line 308 has been formed by etching a second conductive layer arranged above the insulating layer 303, using a third mask layer 306 as an etch mask. The second conductive line 308 may be arranged parallel to the first conductive line 301, having a second end portion arranged to abut the spacer 304. Thus, the first and the second metal line 301, 308 are extending along the same line and separated by the spacer 304.
Figure 3B:
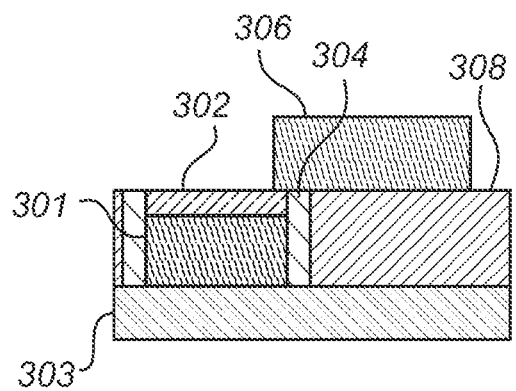
Figure 3C:
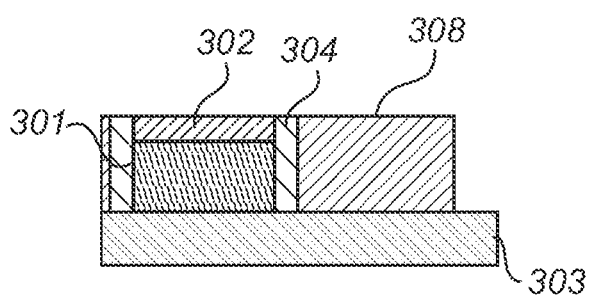

Thus, FIGS. 3A-3D depict embodiments where a second conductive line 308 has been formed by etching a second conductive layer arranged above the insulating layer 303, using a third mask layer 306 as an etch mask. The second conductive line 308 may be arranged parallel to the first conductive line 301, having a second end portion arranged to abut the spacer 304. Thus, the first and the second metal line 301, 308 are extending along the same line and separated by the spacer 304. It is understood that the steps preceding to what is depicted in FIG. 3A are described in FIGS. 1A and 1B. It is understood that a first mask layer 302 is arranged on the first conductive line 301.

Figure 3D:
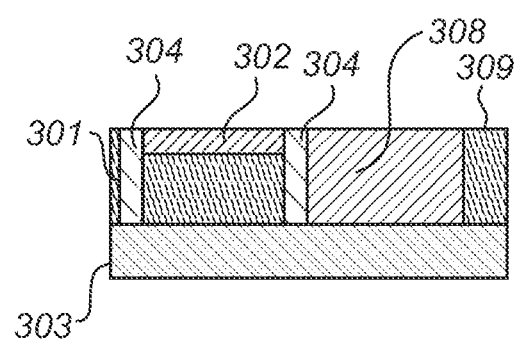

In FIG. 3D, a protective layer 309 has been arranged at a sidewall of a third end portion of the second conductive line, wherein the third end portion is opposite to the second end portion. The protective layer 309 may comprise an insulating material. The insulating material may be an electrically insulating material, typically a dielectric material such as a layer of silicon oxide or some other conventional low-K dielectric layer, to provide insulation to neighbouring structures such as additional conductive lines.

FIGS. 4A-4C' depict top-views of the interconnection structure and intermediate structures corresponding FIGS. 3A-3D. FIGS. 4A, 4A', 4A" correspond to FIG. 3B, FIGS. 4B, 4B' correspond to FIG. 3C, FIGS. 4C, 4C' correspond to FIG. 3D.

FIGS. 4A, 4A', 4A" depict a plurality of first conductive lines arranged separate from each other both in a direction orthogonal to the lines and in a lengthwise direction. Here, a second conductive layer has been formed above the insulating layer 303, followed by a third mask layer 306 patterned to protect the portions of the second conductive layer from which the second conductive lines 308 are to be formed. FIGS. 4B and 4B' show the second conductive layer after it has been etched through the third mask layer 306 to form the second conductive lines 308, and FIGS. 4C and 4C' show the interconnection structure after a protective layer 309 has been arranged around the first and second conductive lines 301, 308.

As indicated in the present figures, a plurality of first conductive lines 301 (in this example three) may be arranged on the insulating layer. Each of the first conductive lines may be arranged separated from each other, at a relatively relaxed pitch. In this example, the spacing between the first conductive lines may be sufficient to motivate the use of individual mask openings in the third mask layer when forming the second conductive lines.

However, as depicted in FIGS. 4A' and 4A", the plurality of first conductive lines may be arranged with tighter pitch as compared to FIG. 4A. As a consequence, neighbouring spacers 304 may at least partly abut each other. Expressed differently, each spacer 304 may be considered to be in contact with at least one other spacer 304. The relatively tight pitch between the first conductive lines allows for a relaxation in the lithography print defining the third mask layer 306, as separate mask portions are not needed for individual lines—see FIG. 4A". Instead, the third mask 306 may comprise a single block protecting all three conductive lines illustrated in FIG. 4A".

In the above the present disclosure has mainly been described with reference to a limited number of examples. However, as is readily appreciated by a person skilled in the art, other examples than the ones disclosed above are equally possible within the scope of the present disclosure, as defined by the appended claims.

The invention claimed is:

1. A method for forming an interconnection structure for a semiconductor device, the method comprising:
    forming a conductive layer on an insulating layer;
    etching the conductive layer to form a first conductive line, using a first mask layer as an etch mask;
    forming a spacer on a side wall of a first end portion of the first conductive line;
    forming a second conductive line, parallel to the first conductive line, having a second end portion, wherein a side wall of the second end portion is arranged to abut the spacer, such that the first and the second conductive lines are extending along the same line and separated by the spacer;

forming a recess in the second conductive line, the recess extending along a portion of the second conductive line; and forming a second mask layer in the recess.

2. The method according to claim 1, wherein forming the second conductive line comprises:

depositing a trench layer above the insulating layer;

etching a trench in the trench layer; and filling the trench with a conductive material to form the second conductive line.

3. The method according to claim 1, wherein forming the second conductive line comprises:

forming a second conductive layer above the insulating layer; and etching the second conductive layer to form the second conductive line, using a third mask layer as an etch mask.

4. The method according to claim 3, comprising:

forming a protective layer at a sidewall of a third end portion of the second conductive line, wherein the third end portion is opposite the second end portion.

5. The method according to claim 1, wherein the recess is laterally spaced apart from the spacer.

6. The method according to claim 1, wherein the first and the second mask layers differ with respect to etch selectivity.

7. The method according to claim 1, wherein a top surface of the first mask layer and a top surface of the second mask layer are arranged at the same vertical level.

8. The method according to claim 1, wherein at least one of the first and second conductive lines is formed of at least one of Ru, Mo, W, Al and Co.

9. The method according to claim 1, wherein the first and second conducting lines consist of different conductive materials.

10. The method according to claim 1, wherein the first and second conducting lines consist of substantially the same conductive material.

11. The method according to claim 3, wherein the first mask layer and the third mask layer differ with respect to etch selectivity.

12. The method according to claim 11, wherein the recess is laterally spaced apart from the spacer.

13. The method according to claim 11, wherein the first and the second mask layers differ with respect to etch selectivity.

14. The method according to claim 11, wherein a top surface of the first mask layer and a top surface of the second mask layer are arranged at the same vertical level.

15. The method according to claim 11, wherein at least one of the first and second conductive lines is formed of at least one of Ru, Mo, W, Al and Co.

16. The method according to claim 11, wherein the first and second conducting lines consist of different conductive materials.

17. The method according to claim 11, wherein the first and second conducting lines consist of substantially the same conductive material.

18. The method according to claim 4, wherein the first mask layer and the third mask layer differ with respect to etch selectivity.

* * * * *